(12) United States Patent
Wang et al.

(10) Patent No.: US 9,860,976 B1
(45) Date of Patent: Jan. 2, 2018

(54) FLEXIBLE ELECTRONIC DEVICE

(71) Applicant: Industrial Technology Research Institute, Hsinchu (TW)

(72) Inventors: Sheng-Po Wang, Taoyuan (TW); Chih-Chia Chang, Hsinchu County (TW); Chao-Jen Wang, Hsinchu (TW); Jui-Chang Chuang, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/394,827

(22) Filed: Dec. 30, 2016

(30) Foreign Application Priority Data

Nov. 28, 2016 (TW) .............................. 105139083 A

(51) Int. Cl.
*H05K 1/16* (2006.01)
*H05K 1/02* (2006.01)
*H05K 1/18* (2006.01)

(52) U.S. Cl.
CPC ............... *H05K 1/028* (2013.01); *H05K 1/18* (2013.01); *H05K 2201/09036* (2013.01); *H05K 2201/09063* (2013.01); *H05K 2201/09227* (2013.01); *H05K 2201/10128* (2013.01); *H05K 2201/10151* (2013.01)

(58) Field of Classification Search
CPC .. H05K 1/00; H05K 1/02; H05K 1/03; H05K 1/09; H05K 1/11; H05K 1/18; H05K 1/28; H05K 3/00; H05K 3/10; H05K 3/14; H05K 3/20
USPC .................... 174/260, 254; 361/749; 29/850; 257/415
See application file for complete search history.

(56) References Cited

U.S. PATENT DOCUMENTS 7,629,691 B2   12/2009 Roush et al.
8,097,926 B2    1/2012 De Graff et al.
(Continued)

FOREIGN PATENT DOCUMENTS

| CN | 101320309 | 12/2008 |
| TW | 200933558 | 8/2009 |
| WO | 2014058473 | 4/2014 |

OTHER PUBLICATIONS

Cho et al., "Engineering the shape and structure of materials by fractal cut," Proceedings of the National Academy of Sciences, Dec. 9, 2014, pp. 17390-17395.
(Continued)

*Primary Examiner* — Xiaoliang Chen
(74) *Attorney, Agent, or Firm* — JCIPRNET

(57) ABSTRACT

According to an embodiment of the present disclosure, a flexible electronic device may include a unit structure including a substrate unit and a wiring structure. The substrate unit has slits to divide connecting portions between respective ends of two slits and wiring regions arranged outwardly from at least one unit center sequentially. The wiring structure is disposed on the substrate unit and includes wirings distributed in the wiring regions. Each wiring includes circumferential portions and radial portions connected between the circumferential portions. The radial portion connected to a first end of each circumferential portion extends toward the unit center from the first end. Each circumferential portion includes a first section and a second section. The first section is closer to the first end and has greater anti-stretching ability than the second section.

20 Claims, 11 Drawing Sheets

(56) References Cited

U.S. PATENT DOCUMENTS

| | | | |
|---|---|---|---|
| 8,492,876 | B2 | 7/2013 | Wong et al. |
| 8,633,916 | B2 | 1/2014 | Bernstein et al. |
| 8,883,287 | B2 | 11/2014 | Boyce et al. |
| 2005/0280157 | A1 | 12/2005 | Roush et al. |
| 2008/0157235 | A1* | 7/2008 | Rogers ............... H01L 21/8258 257/415 |
| 2009/0184954 | A1 | 7/2009 | Street |
| 2010/0096729 | A1 | 4/2010 | Wong |
| 2010/0238636 | A1 | 9/2010 | Mascaro et al. |
| 2010/0298895 | A1 | 11/2010 | Ghaffari et al. |
| 2011/0018556 | A1 | 1/2011 | Le |
| 2011/0031041 | A1 | 2/2011 | Bulea et al. |
| 2011/0139517 | A1 | 6/2011 | Mizushima |
| 2011/0248954 | A1 | 10/2011 | Hamada et al. |
| 2013/0041235 | A1 | 2/2013 | Rogers et al. |
| 2013/0234977 | A1 | 9/2013 | Lin |
| 2013/0281814 | A1 | 10/2013 | Tilt |
| 2013/0319135 | A1 | 12/2013 | Okada et al. |
| 2014/0296687 | A1 | 10/2014 | Irazoqui |
| 2015/0282295 | A1* | 10/2015 | Matsumoto ............. H05K 3/14 361/749 |
| 2015/0282296 | A1* | 10/2015 | Ogura .................... H05K 1/115 174/254 |

OTHER PUBLICATIONS

"Office Action of Taiwan Related Application No. 105144039" dated Apr. 21, 2017, p. 1-p. 5.
Chao-Jen Wang et al., "Structure Constructure by Sheet", Unpublised U.S. Appl. No. 15/229,095, filed Aug. 4, 2016.

\* cited by examiner

FLEXIBLE ELECTRONIC DEVICE

CROSS-REFERENCE TO RELATED APPLICATION

This application claims the priority benefit of a Taiwan application serial no. 105139083, filed on Nov. 28, 2016. The entirety of the above-mentioned patent application is hereby incorporated by reference.

TECHNICAL FIELD

The present disclosure relates to an electronic device, and particularly relates to a flexible electronic device.

BACKGROUND

With the rapid development of electronic technology, new electronic products continue to be introduced. For the electronic products to be applied to different areas, characteristics of flexible, light and thin, and unrestricted appearance have attracted more attention gradually. That is, the appearances of the electronic products are gradually required to be various according to different applications and environments. For three-dimensional shaped electronic products, it may need to manufacture circuits or related wirings on a curved surface. Additionally, the design of the three-dimensional shape may not be a perfect circular or perfect spherical article, and a bent degree or a curvature of the surface thereof must be changed according to the design needs.

SUMMARY

One exemplary embodiment of the present disclosure provides a flexible electronic device including at least one unit structure. The unit structure includes a substrate unit and a wiring structure. The substrate unit has a plurality of slits to divide a plurality of connecting portions and a plurality of wiring regions. Each the connecting portion is located between an end of one of the slits and an end of another of the slits. The wiring regions are arranged outwardly from at least one unit center in sequence. Two adjacent wiring regions are spaced from each other by a portion of the connecting portions and a portion of the slits. The wiring structure is disposed on the substrate unit and includes a plurality of wirings. Each the wiring is distributed in the wiring regions. The wiring includes a plurality of circumferential portions located on different wiring regions and a plurality of radial portions connected between the circumferential portions. A first end of each the circumferential portion is connected to one of the radial portions, and the radial portion extends toward the unit center from the first end. Each the circumferential portion includes a first section and a second section. The first section is closer to the first end and has greater anti-stretching ability than the second section.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain illustrate exemplary embodiments and, together with the description, serve to explain the principles of the disclosure.

DETAILED DESCRIPTION OF DISCLOSED EMBODIMENTS

Figure 1:
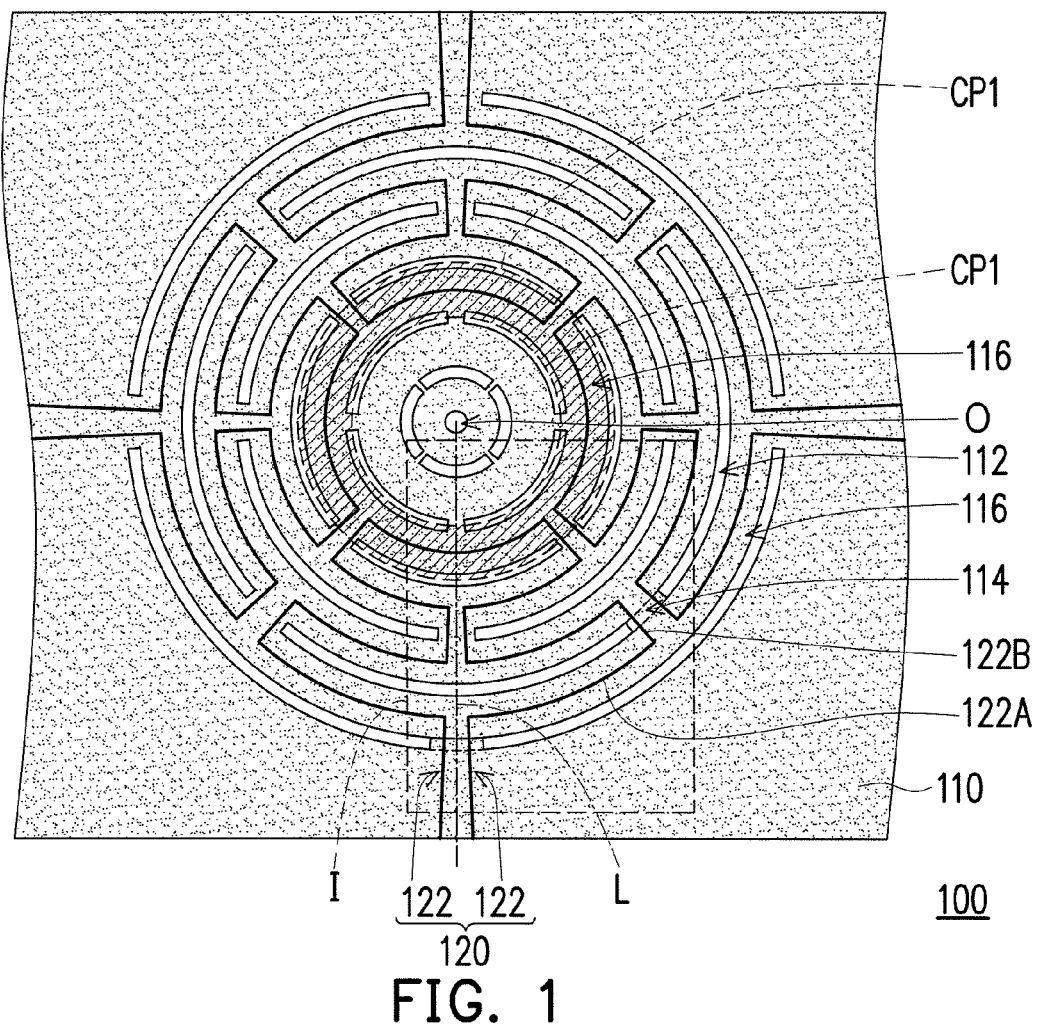
FIG. 1 is a schematic top view of a unit structure to be applied to a flexible electronic device according to an embodiment of the disclosure.

FIG. 1 is a schematic top view of a unit structure applied to a flexible electronic device according to an embodiment of the disclosure. In FIG. 1, a unit structure 100 includes a substrate unit 110 and a wiring structure 120, and the wiring structure 120 is disposed on the substrate unit 110. When the unit structure 100 is applied to an electronic device, the substrate unit 110 may be further provided with electronic components, such as touch components, display components, or sensing components thereon. Also, the wiring structure 120 may be electrically connected to the electronic components to achieve the transmission for electrical signals of the electronic components. In an embodiment, the electronic device that the unit structure 100 is applied to includes a display device, a touch device, a sensing device, and so on, but is not limited thereto.

In the embodiment, the substrate unit 110 is composed of a flexible substrate or a portion of a flexible substrate, for example. The substrate unit 110 could be flexible, and a material thereof includes thin glass or polymer thin films (e.g., PET, PEN), for example, but is not limited thereto.

The substrate unit 110 has a plurality of slits 112. The slits 112 are disposed along a plurality of closed paths CP1, and the closed paths CP1 are arranged outwardly from a unit center O in sequence. Herein, the unit center O is only used as a reference point, and is not limited to be a geometric center of the physical structure. Also, the substrate unit 110 is not necessary to be limited to have a specific structure to define the reference point. In the description herein, a side of each component relatively near the unit center O is named as an inner side, while a side thereof relatively far away from the unit center O is named as an outer side. In the embodiment, the closed path CP1 may be a circular path, an elliptical path, a polygonal path, an octagonal path, or an irregular path. Additionally, the spacings between the closed paths CP1 may be identical or various. The contours and spacings of the closed paths CP1 may be adjusted depending on the needs of different application fields.

Figure 2:
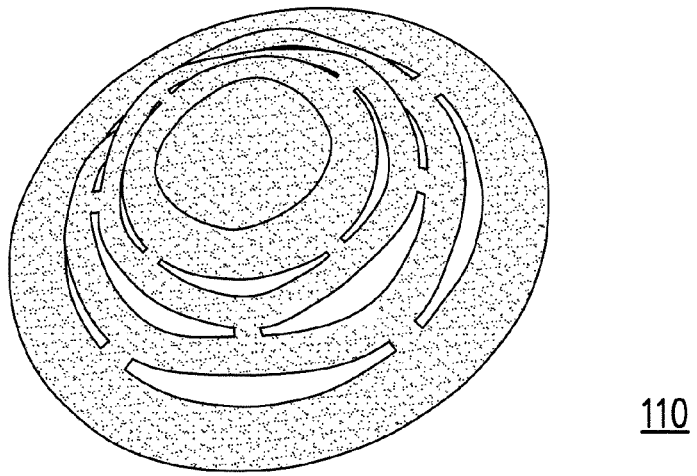
FIG. 2 is a three-dimensional state of the unit structure of FIG. 1 after stretching to be expanded.

Multiple slits 112 are provided on one same closed path CP1, and the slits 112 on the same closed path CP1 are spaced from each other. Therefore, after the substrate unit 110 is stretched, the slits 112 may be expanded, such that the substrate unit 110 can present the three-dimensional state as shown in FIG. 2. In the expanded state as shown in FIG. 2, a contour line of the three-dimensional curved surface foil led by the substrate unit 110 substantially corresponds to the closed path CP1 before stretched (as shown in FIG. 1). That is, the design of the closed path CP1 is substantially related to a profile model to be formed by the expanded substrate unit 110. When the substrate unit 110 is expanded as the three-dimensional state of FIG. 2, the substrate unit 110 may conformally cover on a curved surface. Thus, the unit structure 100 may be applied to a non-planar environment by benefiting from the flexibility of the substrate unit 110. For example, when the unit structure 100 is applied to a sensor, it is helpful to improve the sensing accuracy of the sensor since the unit structure 100 may conformally cover a surface of an object to be sensed. Of course, the aforementioned application is merely exemplary and is not for limiting the range of application of the embodiment. The property of the unit structure 100 which could conform to the non-planar environment is helpful to broaden the application range and increase the application flexibility of the electronic device.

As shown in FIG. 1, the slits 112 divide the substrate unit 110 into a plurality of connecting portions 114 and a plurality of wiring regions 116. Two adjacent slits 112 on the same closed path CP1 are spaced from each other by one connecting portion 114. That is, each of the connecting portions 114 is located between an end of one of the slits 112 and an end of another of the slits 112. In FIG. 1, an area of one of the wiring regions 116 is filled with slant lines to clearly indicate the wiring region 116. Each wiring region 116 is substantially located between two adjacent closed paths CP1, and two adjacent wiring regions 116 are spaced from each other by the connecting portion 114 and the slit 112 on the same closed path CP1. In the meantime, the wiring regions 116 are arranged outwardly from the unit center O in sequence. Also, among the connecting portions 114 arranged outwardly from the unit center O along a reference line L, one slit 112 exists between two adjacent connecting portions 114. That is, the path of the reference line L extending outwardly from the unit center O passes through the connecting portion 114, the wiring region 116, and the slit 112 sequentially and repeatedly.

The wiring structure 120 is disposed on the substrate unit 110, and the wiring structure 120 includes at least one wiring 122. The wiring 122 is distributed in the wiring regions 116. For example, the wiring 122 may wind along at least a portion of the slits 112 in a substantially conformal manner. In an embodiment, when a number of the wiring 122 is multiple, winding paths of two adjacent wirings 122 may be symmetrical to each other. Therefore, the wiring structure 120 may provide a transmission path of the electrical signals extending outwardly from the unit center O. Two adjacent wirings 122 may be connected to each other at one of the wiring regions 116. However, in other embodiments, the wirings 122 may not be connected to each other, so as to form independent transmission paths of the electrical signals from each other. Additionally, the same closed path CP1 can be provided with four slits 112 and four connecting portions 114 thereon, for example. Thus, the wirings 122 may extend outwardly from the four connecting portions 114 at the outermost side to be connected to other wirings or circuits. However, the number of the slits 122 and the connecting portions 114 disposed on the same closed path CP1 may be adjusted and changed according to different application needs, and is not limited to the embodiment.

Figure 3:
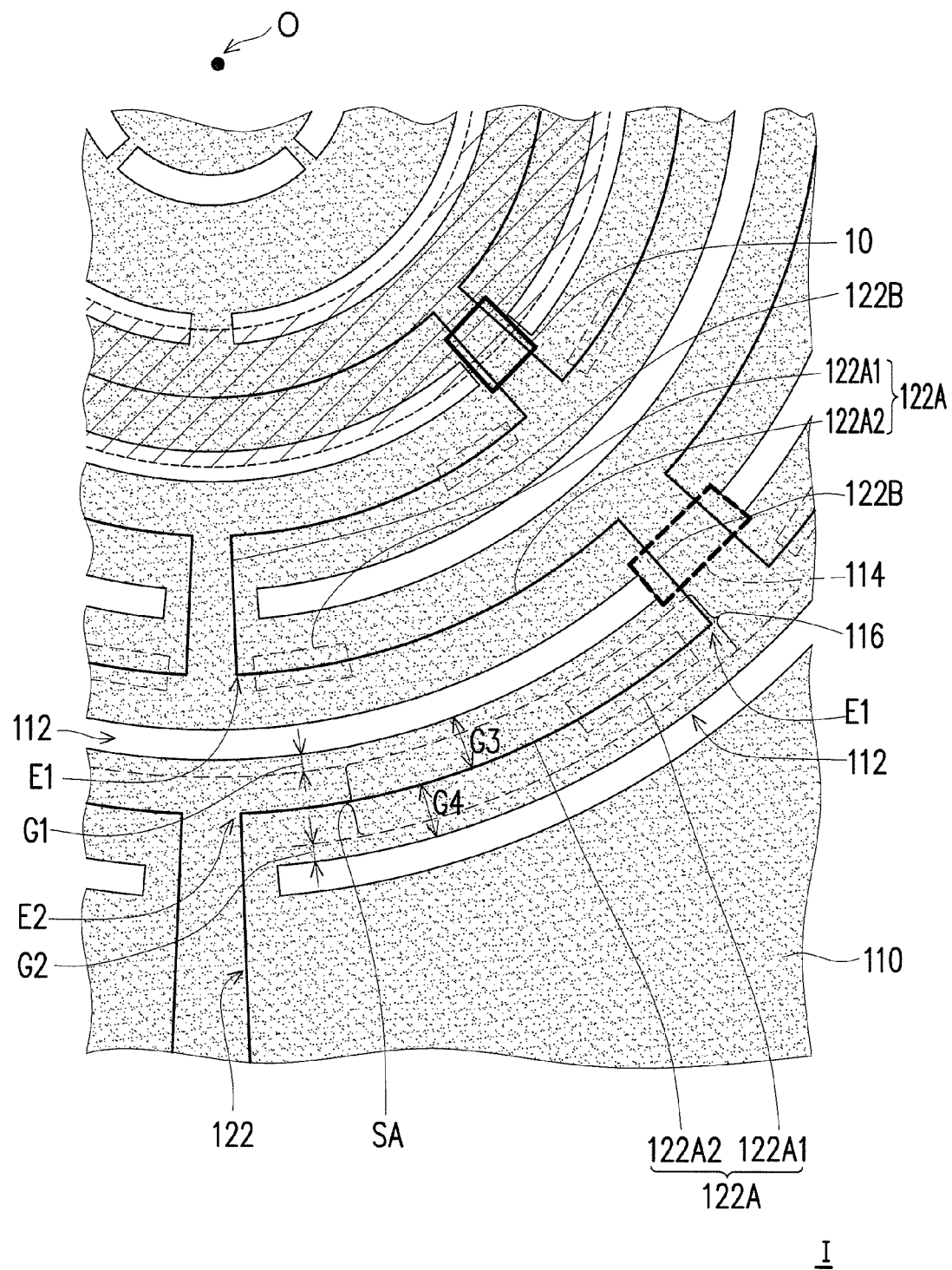
FIG. 3 is an enlarged schematic view of a region I of FIG. 1.

FIG. 3 is an enlarged schematic view of a region I of FIG. 1. FIG. 3 is used to clearly present the design of the wirings 122. Additionally, to describe the application of the unit structure 100, FIG. 3 shows that an electronic component 10 may be disposed on the substrate unit 110 and electrically connected to a portion of the wirings 122 of the wiring structure 120. In an embodiment, the electronic component 10 may be a light-emitting diode, a vibration component, a sensing component, a display component, and so on. When the electronic component 10 needs a single signal, the electronic component 10 may be connected to one wiring 122. When the electronic component 10 is electrically connected to two wirings 122, the two wirings 122 may be used to transmit different signals respectively. Additionally, when the unit structure 100 is applied to the touch technology, two adjacent wirings 122 may be paired with each other to form a mutual capacitance-type touch component, or self capacitance-type touch sensing function may be performed by one single wiring 122 independently.

The wiring 122 includes a plurality of circumferential portions 122A located on different wiring regions 116 and a plurality of radial portions 122B connected between the circumferential portions 122A. Each the circumferential portion 122A has a first end E1 and a second end E2, and the first end E1 and the second end E2 are connected to different radial portions 122B. The radial portion 122B connected to the first end E1 extends toward the unit center O from the first end E1. The radial portion 122B connected to the second end E2 extends away from the unit center O from the second end E2. The wirings 122 may define the transmission path of the electrical signals distributed in a meandering path extending from the periphery to the unit center O and surrounding the slits 112. Herein, the description of "radial" means a direction extending radially outward from the unit center O, while the description of "circumferential" means a direction substantially conforming to the extension direction of the wiring region 116 but not limited to be parallel to the wiring region 116. Thus, the description of radial and circumferential may be orthogonal to each other, but is not limited thereto.

When the substrate unit 110 is stretched by a force to expand the slit 112, the stress applied to each wiring region 116 is not necessarily distributed uniformly. Thus, a layout area SA on each wiring region 116 may be set according to the application needs. For example, the layout area SA may be designed in a region subjected to a relatively small stress in the stretched state, and the circumferential portion 122A may be disposed in the layout area SA. Although only one wiring 122 located in one layout area SA is schematically illustrated in the embodiment, the layout area SA may be provided with a plurality of wirings 122 therein in other embodiments. Additionally, a line width of the wiring 122 may be less than 30 μm, for example, and the plurality of wirings 122 disposed in the same layout area SA may have different line widths or the same line width. In an embodiment, a first spacing distance G1 between the layout area SA and the slit 112 at an inner side may be optionally smaller than a second spacing distance G2 between the layout area SA and the slit 112 at an outer side. Additionally, the extension direction of the circumferential portion 122A may be adjusted according to different design needs. For example, a portion of the circumferential portion 122A closer to the first end E1 may be closer to the slit 112 located at the inner side, or conversely. Additionally, a first spacing distance G3 between the circumferential portion 122A and the slit 112 at the inner side may be optionally equal to or smaller than a second spacing distance G4 between the circumferential portion 122A and the slit 112 at the outer side. Alternatively, the circumferential portion 122A may be disposed along a center line of the wiring regions 116.

Additionally, each the circumferential portion 122A includes a first section 122A1 and a second section 122A2, wherein the first section 122A1 is closer to the first end E1 than the second section 122A2. In an embodiment, the first section 122A1 is located between the second section 122A2 and the first end E1, and the second section 122A2 is located between the first section 122A1 and the second end E2. When the substrate unit 110 provided with the wiring structure 120 is expanded as the state of FIG. 2, the first section 122A1 may be subjected to a relatively high stress. The embodiment may be further provided with the wiring 122 in a manner that the first section 122A1 has greater anti-stretching ability than the second section 122A2. Herein, the anti-stretching ability can be understood as the tolerance of a structure on the stretching force, and may be determined by the stress stretching the structure until the structure is completely broken to form discontinuous parts. The wiring 122 having two sections has various extents of anti-stretching ability, which reduces the probability that the wiring 122 is broken or discontinuous after the substrate unit 110 is expanded. In other words, the circumferential portion 122A of the wiring 122 is divided into two sections. Also, when the first section 122A1 has stronger mechanical properties, it is helpful to improve anti-stretching characteristics and service life of the unit structure 100. In an embodiment, when measuring along the extension direction of one of the circumferential portions 122A, the first section 122A1 of the circumferential portion 122A may account for 10% to 50%, or 30% to 50%, of a length of the overall circumferential portions 122A.

Figure 4:
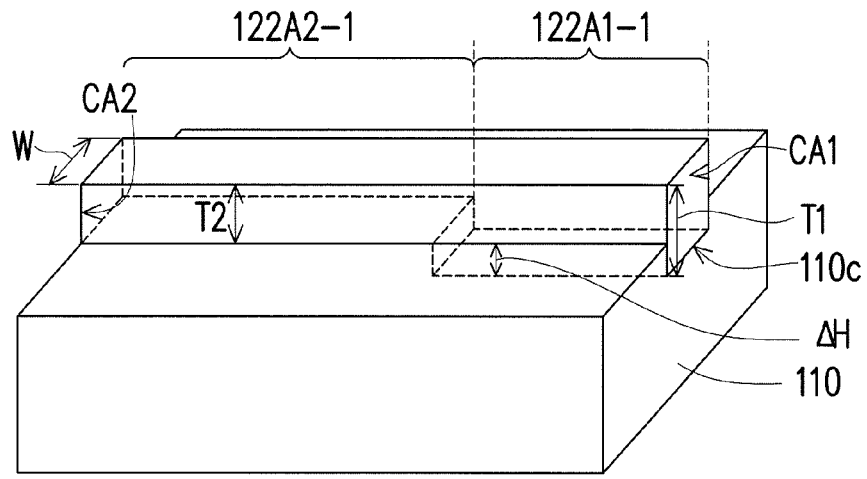
FIG. 4 is a partial schematic three-dimensional view of a circumferential portion according to an embodiment.

To improve the anti-stretching ability of the first section 122A1, the structural design of the first section 122A1 may be different from that of the second section 122A2. For example, FIG. 4 illustrates a partial three-dimensional structure of the circumferential portion according to an embodiment. In the case of the embodiment of FIG. 4, the first section 122A1-1 and a second section 122A2-1 have the same line width W substantially. In the meantime, a thickness T1 of the first section 122A1-1 is more than a thickness T2 of the second section 122A2-1. Thus, when a cross-sectional area is measured in a direction parallel to a direction of the line width W, a cross-sectional area CA1 of the first section 122A1-1 may be larger than a cross-sectional area CA2 of the second section 122A2-1. In this embodiment, a portion in the first section 122A1-1 corresponding to a thickness difference ΔH shown in the drawing may be embedded in the substrate unit 110. That is, the substrate unit 110 may have a recess 110C corresponding to the first section 122A1-1, and a portion of volume of the first section 122A1-1 corresponding to the thickness difference ΔH may be disposed in the recess 110C. Therefore, in comparison with the second section 122A2-1, the first second 122A1-1 may have greater anti-stretching ability.

Figure 5:
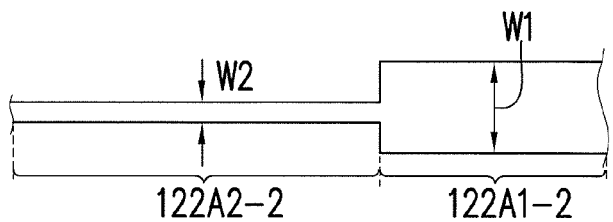
FIG. 5 is a partial schematic top view of a circumferential portion according to an embodiment.
Figure 6:
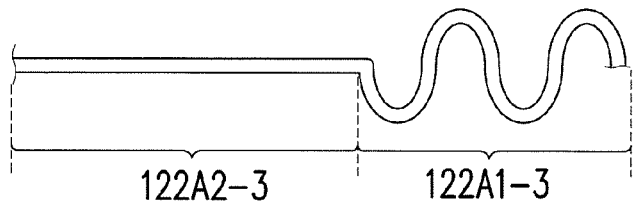
FIG. 6 is a partial schematic top view of a circumferential portion according to an embodiment.

FIG. 5 is a partial schematic top view of the circumferential portion according to an embodiment. From FIG. 5, a first section 122A1-2 has a first line width W1, and a second section 122A2-2 has a second line width W2. Also, the first line width W1 is larger than the second line width W2, such that the first section 122A1-2 has greater anti-stretching ability than the second section 122A2-2. FIG. 6 is a partial schematic top view of the circumferential portion according to an embodiment. From FIG. 6, a first section 122A1-3 is a segment having a wavy shape, and a second section 122A2-3 is a linear segment. Thus, the first section 122A1-3 has greater anti-stretching ability than the second section 122A2-3. In other embodiments, the first section 122A1-3 being the segment having the wavy shape may be designed as a segment having a bent shape. That is, bending points thereof may be sharper than the type illustrated in FIG. 6.

Figure 7:
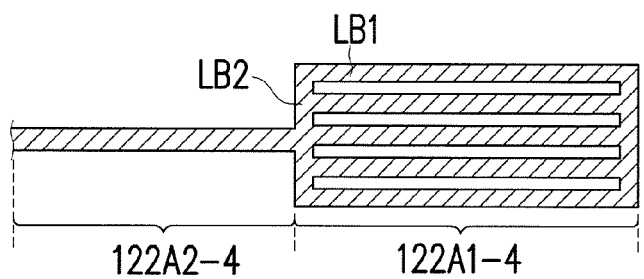
FIG. 7 is a partial schematic top view of a circumferential portion according to an embodiment.

FIG. 7 is a partial schematic top view of the circumferential portion according to an embodiment. From FIG. 7, a first section 122A1-4 includes a plurality of sub-segments LB1 and a plurality of connecting segments LB2, and a second section 122A2-4 is a single line segment. The sub-segments LB1 are connected in parallel to each other by the connecting segments LB2. In the embodiment, each the sub-segment LB1 and the connecting segment LB2 may have a linear shape, but it is not limited thereto. For example, at least one of the sub-segments LB1 and the connecting segments LB2 may have a bent shape, a wavy shape, an arc shape, or other type of shapes. Additionally, the connecting segment LB2 is not limited to be located at an end of the sub-segment LB1. In other embodiments, the connecting segment LB2 may not be configured at the end of the sub-segments LB1, while the sub-segments LB1 and the connecting segments LB2 may be connected to form a grid.

Figure 8:
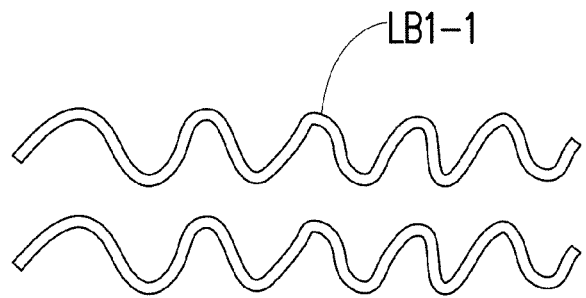
FIG. 8 is a schematic view of sub-segments having a wavy shape according to an embodiment.
Figure 9:
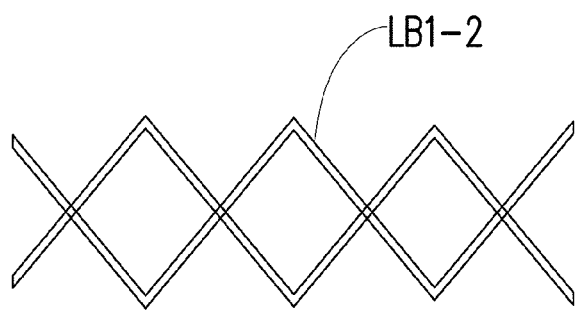
FIG. 9 is a schematic view of sub-segments having a bent shape according to an embodiment.
Figure 10:
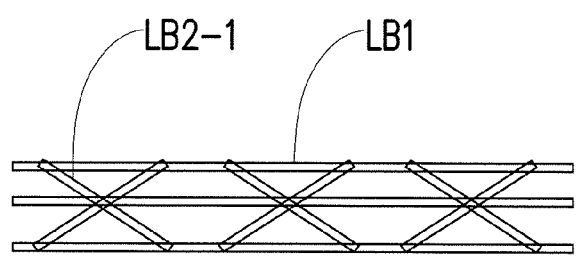
FIG. 10 is a schematic view of a grid formed by the connected sub-segments and connecting segments connected according to an embodiment.
Figure 11:
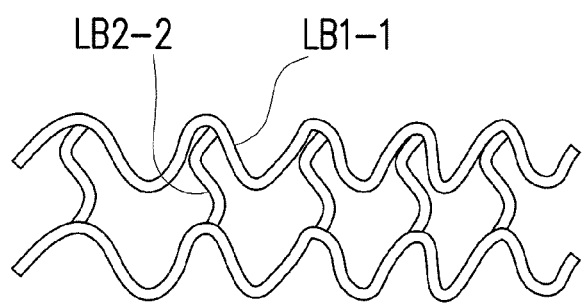
FIG. 11 is a schematic view of sub-segments having a wavy shape and connecting segments according to an embodiment.

FIG. 8 is a schematic view of sub-segments having a wavy shape according to an embodiment. In FIG. 8, sub-segments LB1-1 have a wavy shape and are not interleaved with each other. FIG. 9 is a schematic view of sub-segments having a bent shape according to an embodiment. In FIG. 9, sub-segments LB1-2 have a bent shape and are connected to one another at the bending tip point. FIG. 10 is a schematic view of sub-segments and connecting segments connected to form a grid according to an embodiment. In FIG. 10, the sub-segments LB1 are disposed in parallel as the example shown in FIG. 7. Connecting segments LB2-1 are oriented to an inclined direction and connect the sub-segments LB1 together. Herein, the connecting segments LB2-1 may be designed in the manner of an "X" shape, but it is not limited thereto. FIG. 11 is a schematic view of sub-segments and connecting segments having a wavy shape according to an embodiment. In FIG. 11, both the sub-segments LB1-1 and the connecting segments LB2-2 have a wavy shape, and the connecting segment LB2-2 may not be configured at the end of the sub-segments LB1-1, such that the sub-segments LB1-1 and the connecting segments LB2-2 form a grid.

The aforementioned descriptions with FIG. 4 to FIG. 11 shows several wiring designs capable of achieving the first section 122A1 having greater anti-stretching ability than the second section 122A2. However, the disclosure is not limited thereto. In other embodiments, methods other than the above may be used to improve the anti-stretching ability of the first section 122A1. For example, the first section 122A1 may be made by the material having relatively greater anti-stretching ability. Additionally, by material selection, the first section 122A1 may be made by using a suitable material, such that an elastic modulus of the first section 122A1 is closer to that of the substrate unit 110. Thereby, phenomenon of stress concentration at the first section 122A1 may be reduced when the substrate unit 110 is stretched.

Figure 12A:
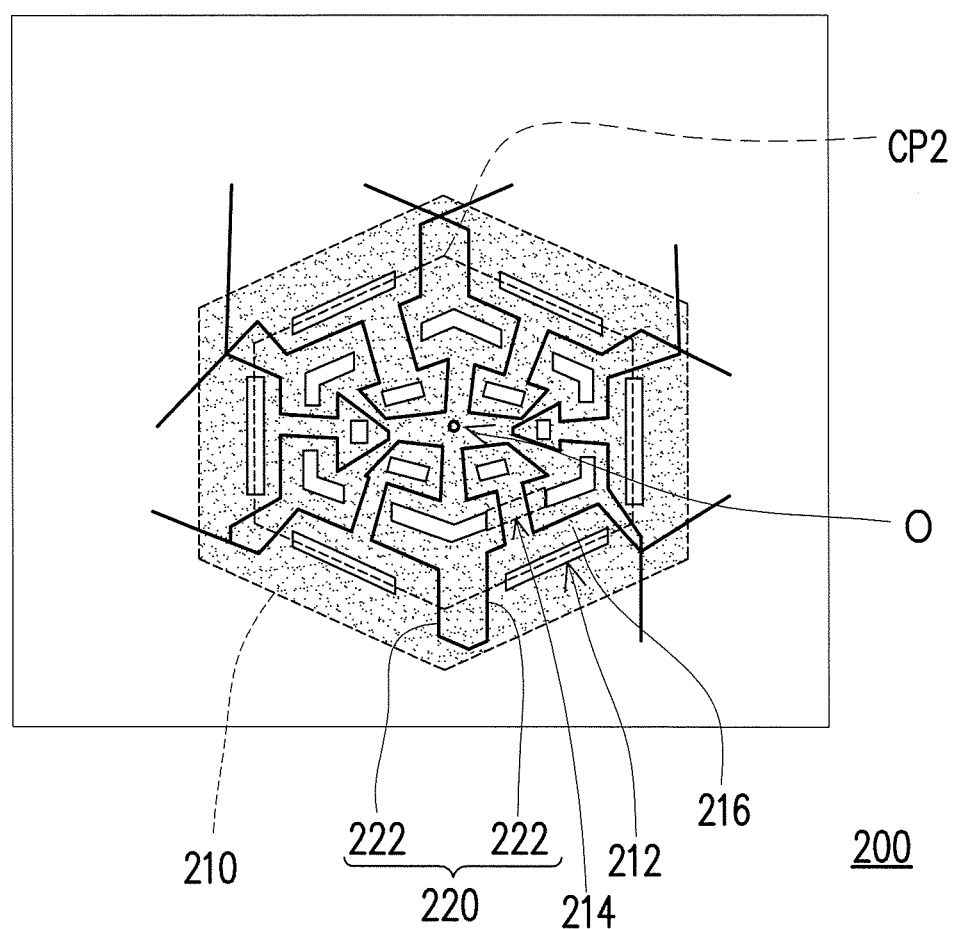
FIG. 12A is a schematic top view of a unit structure applied to the flexible electronic device according to another embodiment of the disclosure.

FIG. 12A is a schematic top view of the unit structure applied to the flexible electronic device according to another embodiment of the disclosure. Referring to FIG. 12A, a unit structure 200 includes a substrate unit 210 and a wiring structure 220, and the wiring structure 220 is disposed on the substrate unit 210. When the unit structure 200 is applied to an electronic device, the substrate unit 210 may be further provided with electronic components, such as touch components, display components, or sensing components thereon. Also, the wiring structure 220 may be electrically connected to the electronic components to achieve the transmission for the electrical signals of the electronic components. The substrate unit 210, which is similar to the embodiment of FIG. 1, has a plurality of slits 212. The slits 112 are disposed along a plurality of closed paths CP2, and the closed paths CP2 are arranged outwardly from the unit center O in sequence. In the embodiment, the closed path CP2 is a hexagonal path, for example. The contour and spacing design of the closed paths CP2 may be adjusted depending on the needs of different application areas.

The slits 212 divide the substrate unit 210 into a plurality of connecting portions 214 and a plurality of wiring regions 216. Two adjacent slits 212 on the same closed path CP2 are spaced from each other by one connecting portion 214. The wiring structure 220 is disposed on the substrate unit 210, and the wiring structure 220 includes at least one wiring 222 distributed in the wiring region 216. For example, the wiring 222 may wind along at least a portion of the slits 212 in a substantially conformal manner. Generally speaking, the closed path CP1 in the embodiment of FIG. 1 is circular, while the closed path CP2 of the embodiment is hexagonal as examples. The disclosure is not limited thereto. In the embodiment, the configuration and the layout of the wirings 222 and the structural design of the wiring may refer to the related descriptions of the embodiments of FIG. 1 and FIG. 11. Also, the substrate unit 210 may also refer to the description in the embodiment of FIG. 1 to be a flexible substrate. Additionally, the structural design of the wirings 222 may be achieved by using any one of FIG. 4 to FIG. 11 or other methods capable of achieving the required anti-stretching ability.

Figure 12B:
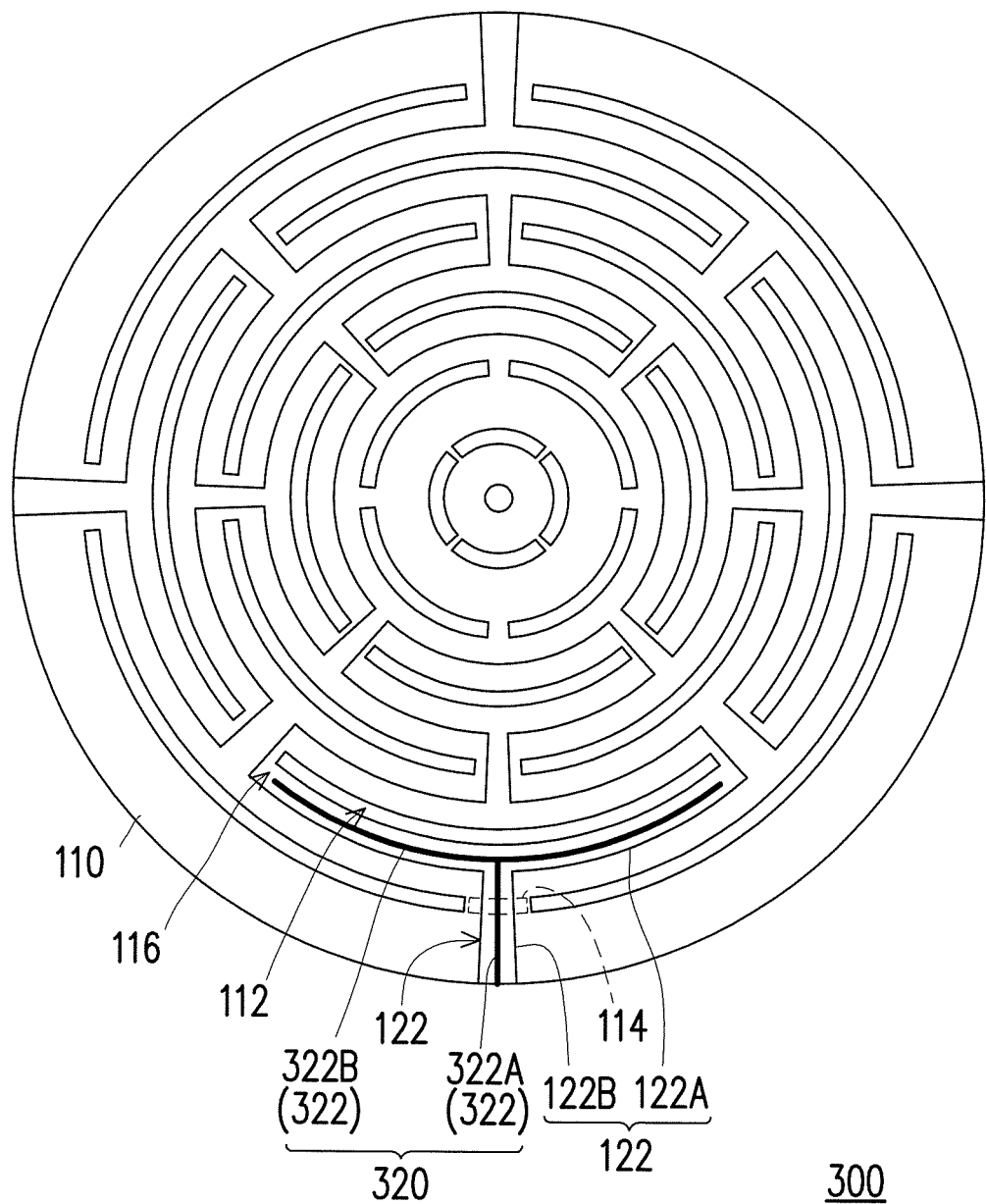
FIG. 12B and FIG. 12C are schematic top views of the unit structure applied to the flexible electronic device according to other embodiments of the disclosure.
Figure 12C:
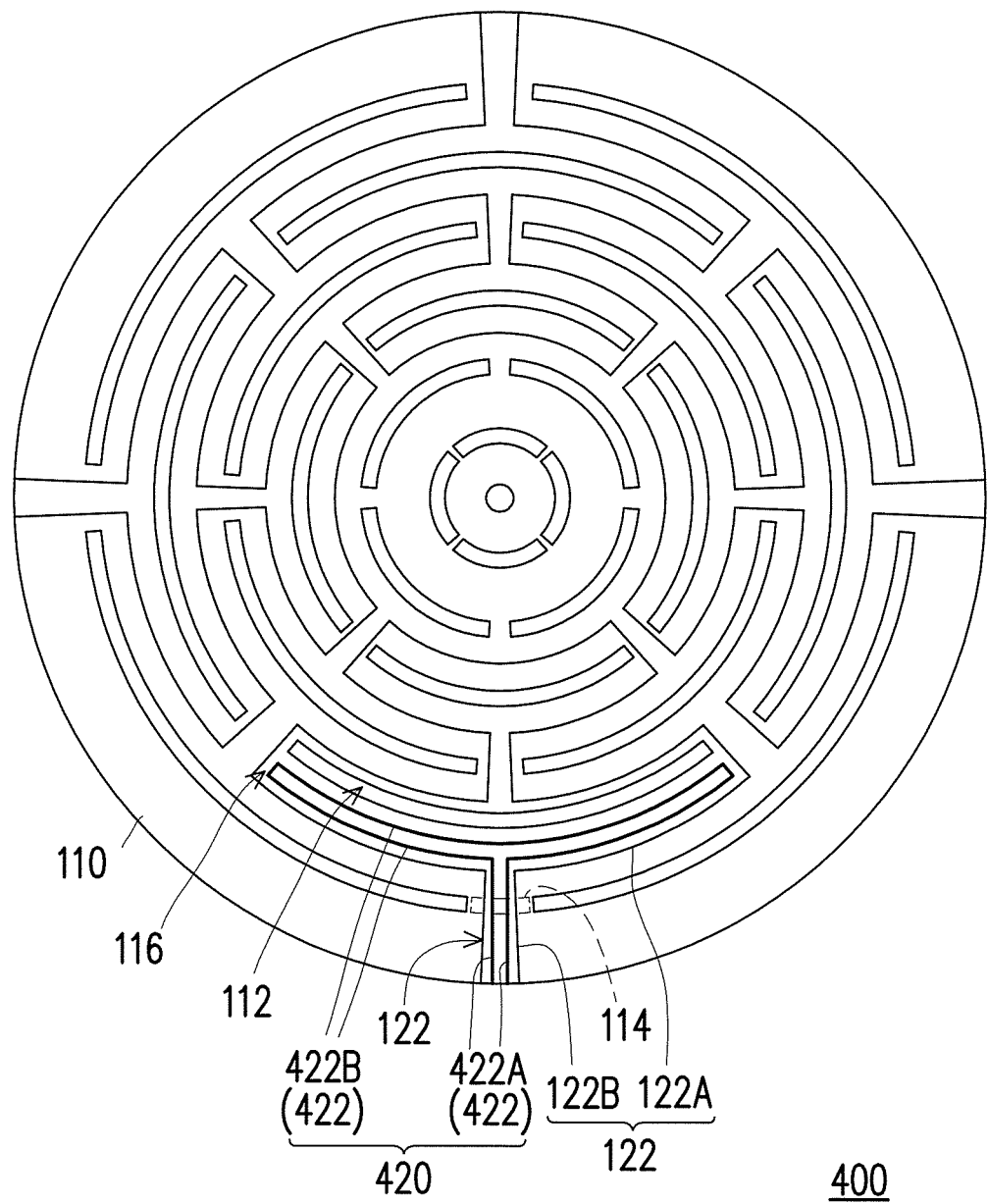

FIG. 12B and FIG. 12C are partial schematic top views of the unit structure applied to the flexible electronic device according to other embodiments of the disclosure. Referring to FIG. 12B, a unit structure 300 includes the substrate unit 110 and a wiring structure 320, and the wiring structure 320 is disposed on the substrate unit 110. The substrate unit 110, which may be similar to the embodiment of FIG. 1, has the plurality of slits 112. The slits 112 divide the substrate unit 110 into the plurality of connecting portions 114 and the plurality of wiring regions 116. The wiring structure 320 includes at least one wiring 122 and at least one inner wiring 322, wherein the layout of the wirings 122 in the substrate unit 110 is similar to the design depicted in the embodiment of FIG. 1. The inner wiring 322 includes an inner wiring radial portion 322A and an inner wiring circumferential portion 322B connected to the inner wiring radial portion 322A. The inner wiring circumferential portion 322B may be located between the circumferential portion 122A of one of the wirings 122 and one of the slits 112. The inner wiring radial portion 322A and the radial portion 122B of one of the wirings 122 may be located on the same connecting portion 114. Additionally, the inner wiring radial portion 322A and the inner wiring circumferential portion 322B may be connected to form a T shape, for example, which is surrounded by one of the wirings 122 and one of the slits 112.

In FIG. 12C, a unit structure 400 may be substantially similar to the unit structure 300. An inner wiring 422 in the unit structure 400 includes a plurality of inner wiring radial portions 422A and a plurality of inner wiring circumferential portions 422B connected to the inner wiring radial portions 422A. The inner wiring circumferential portion 422B is located between the circumferential portion 122A of one of the wirings 122 and one of the slits 112. The inner wiring radial portion 422A and the radial portion 122B of one of the wirings 122 are located on the same connecting portion 114. Additionally, the inner wiring radial portions 422A and the inner wiring circumferential portions 422B may be enclosed to form a T-shaped region, for example. In the embodiments of FIG. 12B and FIG. 12C, the substrate unit 110 may also refer to the description of the embodiment of FIG. 1 to be a flexible substrate. Additionally, the structural design of the wirings 122, the inner wirings 322, and the inner wirings 422 may be achieved by using any one of FIG. 4 to FIG. 11 or other methods capable of achieving similar anti-stretching ability.

Figure 13:
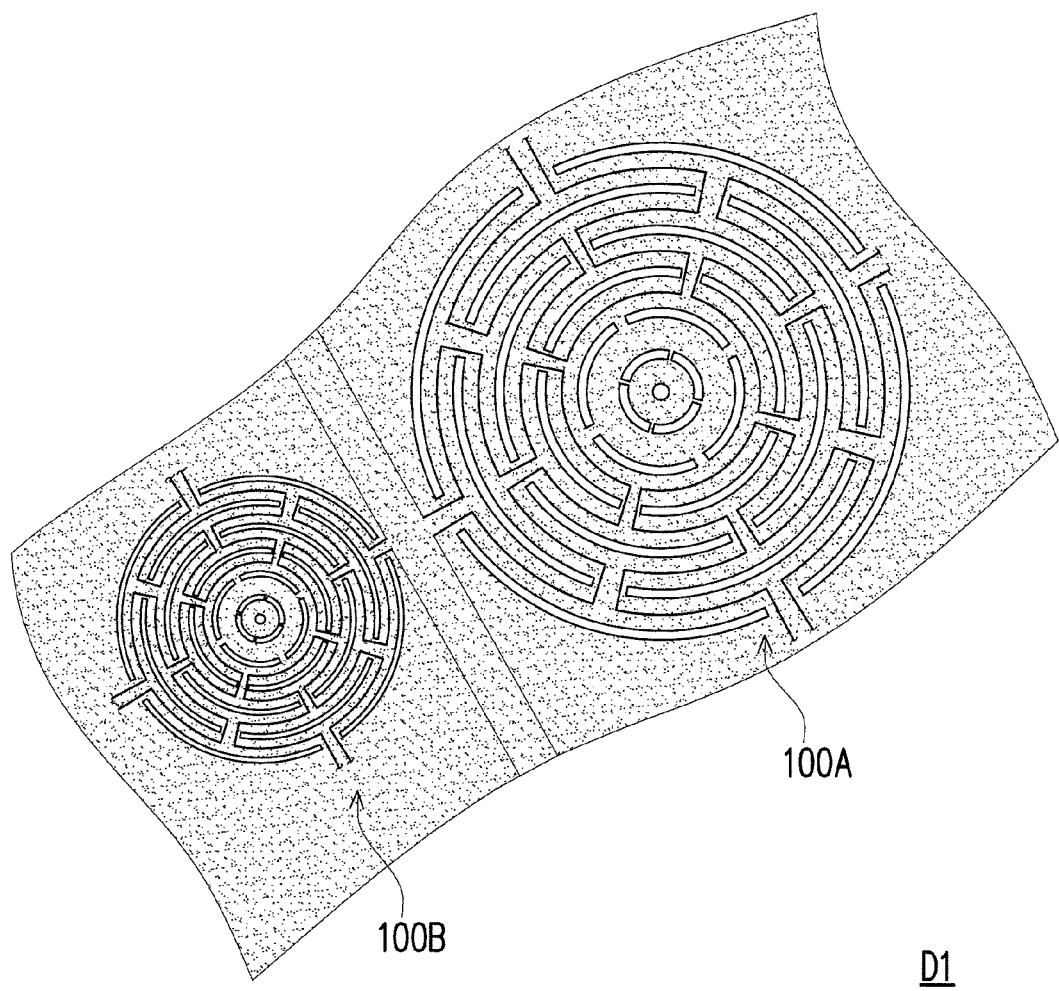
FIG. 13 is a partial schematic top view of the flexible electronic device according to an embodiment of the disclosure.

FIG. 13 is a partial schematic top view of the flexible electronic device according to an embodiment of the disclosure. Referring to FIG. 13, a flexible electronic device D1 includes a unit structure 100A and a unit structure 100B, wherein a size of the unit structure 100A is different from that of the unit structure 100B. The size of the unit structure 100A is larger than that of the unit structure 100B. In the embodiment, the design of the unit structure 100A and the unit structure 100B may be individually similar to the unit structure 100 described in FIG. 1 to FIG. 11, and is not repeated. Additionally, from the descriptions of the above embodiments, both the unit structure 100A and the unit structure 100B respectively include a substrate unit. In the embodiment, the substrate unit of the unit structure 100A and the substrate unit of the unit structure 100B are composed of an integrated flexible substrate. In other words, there may be no structural boundary between the substrate unit of the unit structure 100A and the substrate unit of the unit structure 100B, and they are defined as different regions on the same flexible substrate.

Figure 14:
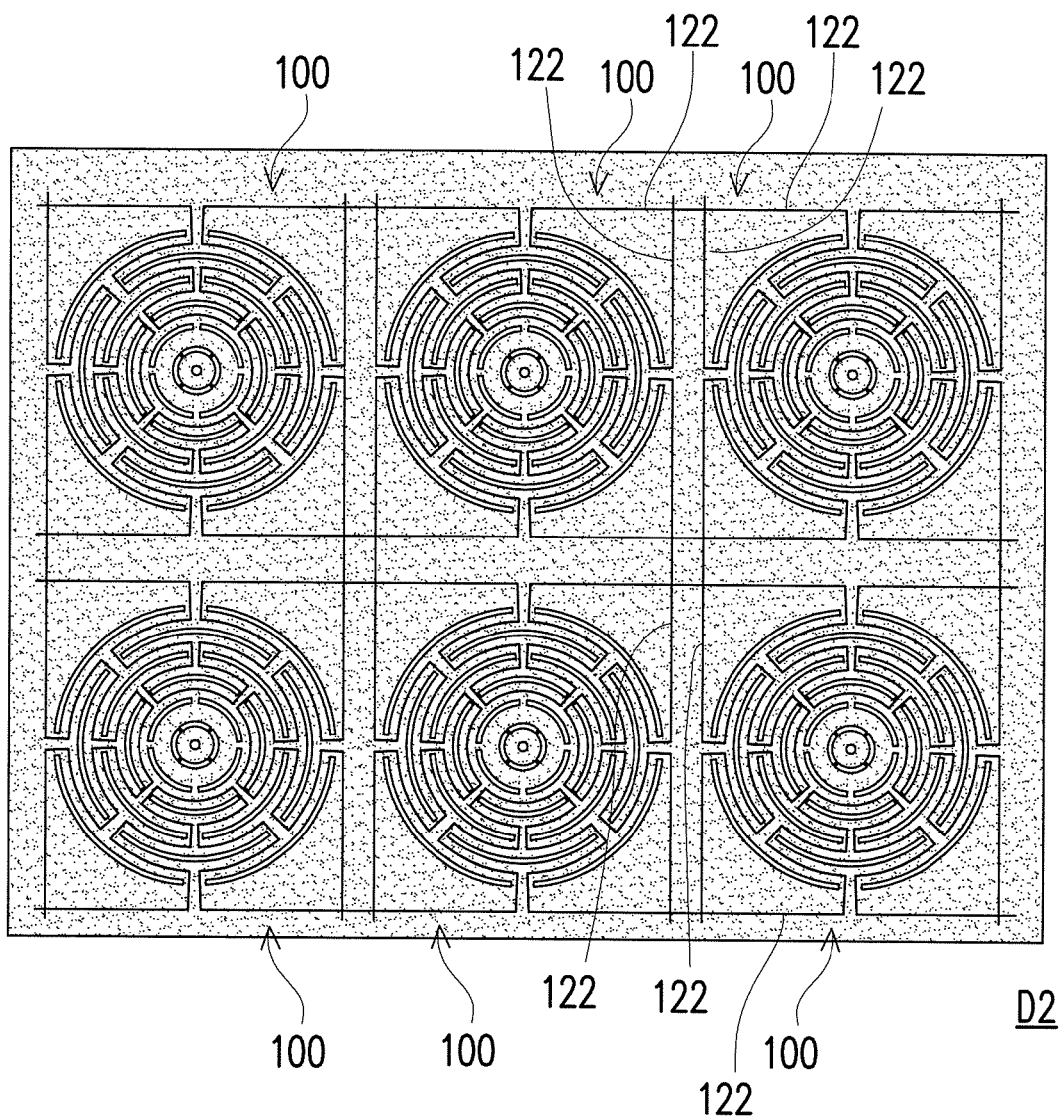
FIG. 14 is a partial schematic top view of the flexible electronic device according to another embodiment of the disclosure.

FIG. 14 is a partial schematic top view of the flexible electronic device according to another embodiment of the disclosure. Referring to FIG. 14, a flexible electronic device D2 includes a plurality of unit structures 100 arranged in an array, wherein the design of each the unit structure 100 may be similar to the unit structure 100 described in FIG. 1 to FIG. 11, and the technical features described in FIG. 1 to FIG. 11 may be applied to the embodiment. The wirings 122 of each the unit structure 100 may extend outwardly to be connected to the wirings of the adjacent unit structure 100. However, with the needs of the application, the wirings 122 of each unit structure 100 may not be connected to the wirings 122 of other unit structures 100. In the embodiment, the sizes of the unit structures 100 are the same substantially and arranged in an array. When the flexible electronic device D2 is in an expanded state in a practical application, the unit structures 100 may conform to the applied environment to form concave or convex three-dimensional structures.

Figure 15:
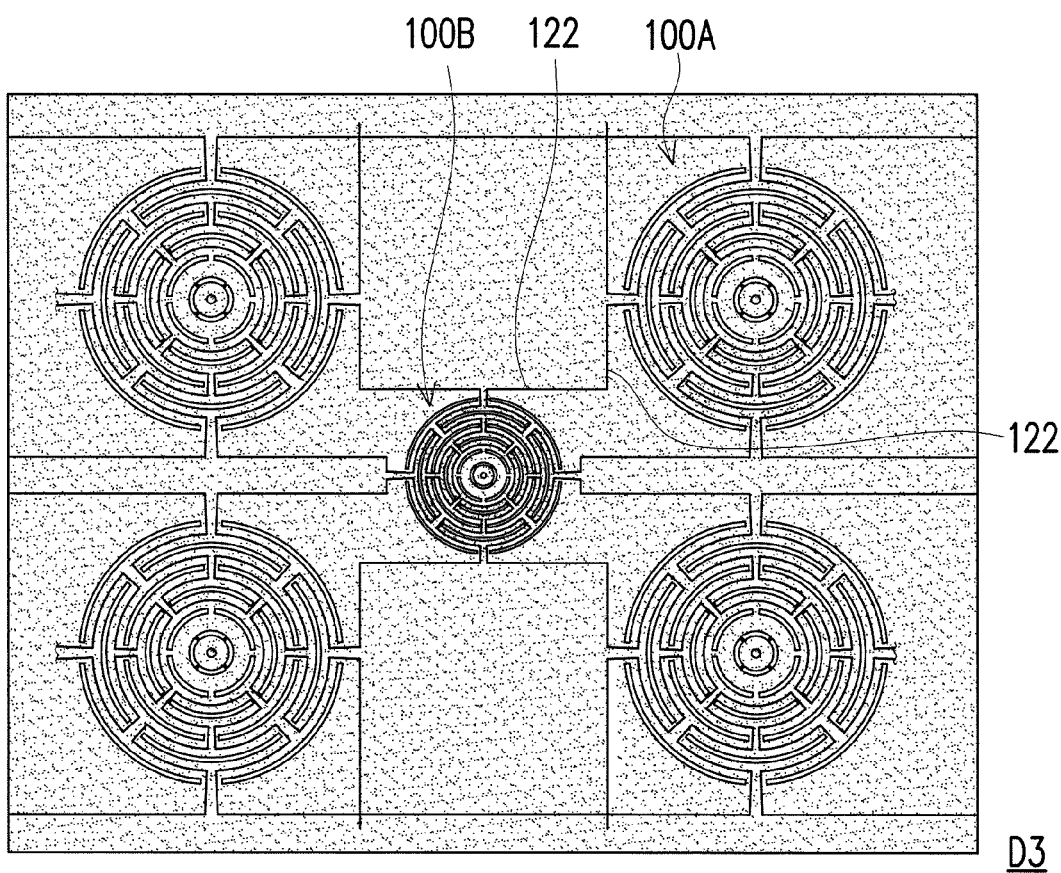
FIG. 15 is a partial schematic top view of the flexible electronic device according to yet another embodiment of the disclosure.

FIG. 15 is a partial schematic top view of the flexible electronic device according to yet another embodiment of the disclosure. Referring to FIG. 15, a flexible electronic device D3 includes a plurality of unit structures 100A arranged in an array and at least one unit structure 100B, wherein the size of the unit structure 100A is different from that of the unit structure 100B. However, the design of the unit structure 100A and the unit structure 100B may be similar to the unit structure 100 described in any of FIG. 1 to FIG. 11. In the embodiment, the wirings 122 of the unit structure 100B may extend outwardly to be connected to the wirings 122 of other unit structures 100A. However, the wirings 122 of the unit structure 100A and the unit structure 100B may respectively extend outwardly and independently without being connected to each other, such that each the wiring 122 may define an independent transmission path of the electrical signals.

Figure 16:
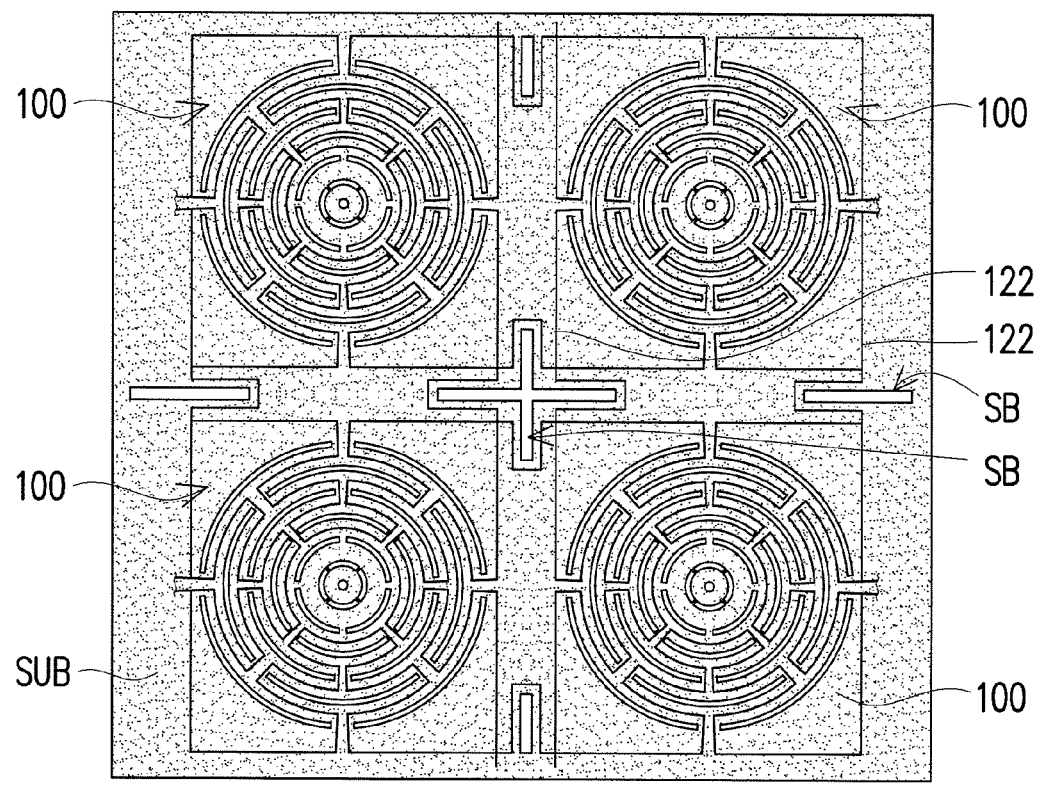
FIG. 16 is a partial schematic top view of the flexible electronic device according to yet another embodiment of the disclosure.

FIG. 16 is a partial schematic top view of the flexible electronic device according to yet another embodiment of the disclosure. Referring to FIG. 16, a flexible electronic device D4 includes a plurality of unit structures 100 arranged in an array, wherein the design of each the unit structure 100 may be similar to the unit structure 100 described in FIG. 1 to FIG. 11, and the technical features described in FIG. 1 to FIG. 11 may be applied to the embodiment. As the aforementioned embodiments of the flexible electronic devices D1 to D3, the substrate units of the plurality of the unit structures 100 are defined by the different regions of a single flexible substrate SUB. In the embodiment, the flexible substrate SUB may have a plurality of peripheral slits SB located between adjacent substrate units 100. Also, one of the wirings 122 of the wiring structure of one of the unit structures 100 may extend toward another unit structure 100 and be disposed bending around one of the peripheral slits SB. Therefore, when the flexible substrate SUB is stretched, the peripheral slits SB may also be expanded, such that the flexible electronic device D4 may further conform to the applied non-planar environment.

The unit structure of the electronic device of the embodiment of the disclosure has the plurality of slits, so as to provide a flexible and stretchable using application. The wiring on the unit structure winds along the slits in a substantially conformal manner, and an individual portion of the wiring (i.e., the circumferential portion in the above) has the first section with greater anti-stretching ability in the region where the stress is relatively concentrated. Thus, the damage, such as wiring breakage and the like, is not easy to occur in the flexible electronic device having the unit structure of the embodiment of the disclosure which is stretched or expanded in the use of the process. In general, the flexible electronic device according to the embodiment of the disclosure has better stretch tolerance.

It will be clear that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A flexible electronic device, comprising at least one unit structure, the at least one unit structure comprising:

a substrate unit, having a plurality of slits to divide a plurality of connecting portions and a plurality of wiring regions, each of the connecting portions being located between an end of one of the slits and an end of another of the slits, the wiring regions being arranged outwardly from at least one unit center in sequence, and two adjacent wiring regions being spaced from each other by a portion of the connecting portions and a portion of the slits; and a wiring structure, disposed on the substrate unit, the wiring structure comprising a plurality of wirings, each of the wirings being distributed in the wiring regions, wherein each the wiring comprises a plurality of circumferential portions located on different wiring regions and a plurality of radial portions connected between the circumferential portions, a first end of each of the circumferential portions is connected to one of the radial portions, and the one of the radial portions extends toward the unit center from the first end, each of the circumferential portions comprises a first section and a second section, and the first section is closer to the first end and has greater anti-stretching ability than the second section.

2. The flexible electronic device according to claim 1, wherein a cross-sectional area of the first section and a cross-sectional area of the second section are measured parallel to a line width direction of the circumferential portion, and the cross-sectional area of the first section is larger than the cross-sectional area of the second section.

3. The flexible electronic device according to claim 1, wherein the substrate unit has a recess, and at least a portion of volume of the first section is located in the recess.

4. The flexible electronic device according to claim 1, wherein the first section has a bent shape or a wavy shape.

5. The flexible electronic device according to claim 1, wherein the first section comprises a plurality of sub-segments and a plurality of connecting segments, and the sub-segments are connected to each other via the connecting segments.

6. The flexible electronic device according to claim 5, wherein the sub-segments and the connecting segments are connected to form a grid, or at least one of the sub-segments and the connecting segments has a bent shape or a wavy shape.

7. The flexible electronic device according to claim 1, wherein a length of the first section measured along an extension direction of one of the circumferential portions accounts for 10% to 50% of a length of the one of the circumferential portions.

8. The flexible electronic device according to claim 1, wherein a second end of each of the circumferential portions is connected to another radial portion, and the another radial portion extends from the second end in a direction away from the unit center.

9. The flexible electronic device according to claim 1, wherein one of the slits exists between two adjacent connecting portions among the connecting portions arranged outwardly from the unit center along a reference line in sequence.

10. The flexible electronic device according to claim 1, wherein one of the wiring regions is provided with a layout area thereon, the circumferential portion is disposed within the layout area, and a first spacing distance between the layout area and the slit at an inner side is smaller than a second spacing distance between the layout area and the slit at an outer side.

11. The flexible electronic device according to claim 1, wherein one circumferential portion is disposed along a center line of one corresponding wiring regions.

12. The flexible electronic device according to claim 1, wherein a first spacing distance between one circumferential portion and one corresponding slit at an inner side is smaller than a second spacing distance between the circumferential portion and the slit at an outer side.

13. The flexible electronic device according to claim 1, further comprising an electronic component, disposed on the substrate unit and electrically connected to at least one of the wirings of the wiring structure.

14. The flexible electronic device according to claim 1, wherein two adjacent of the wirings are connected to each other in one of the wiring regions.

15. The flexible electronic device according to claim 1, wherein two adjacent of the wirings are symmetrical to each other.

16. The flexible electronic device according to claim 1, wherein the flexible electronic device comprises a plurality of unit structures, and a plurality of substrate units of the plurality of unit structures are composed of an integrated flexible substrate.

17. The flexible electronic device according to claim 16, wherein the flexible substrate has a plurality of peripheral slits located between adjacent substrate units.

18. The flexible electronic device according to claim 17, wherein one wiring of one of the unit structures extends toward another unit structure and winds around one of the peripheral slits.

19. The flexible electronic device according to claim 16, wherein a portion of wirings of different unit structures are connected to each other.

20. The flexible electronic device according to claim 1, wherein the wiring structure further comprises at least an inner wiring, the inner wiring comprises at least an inner wiring radial portion and at least an inner wiring circumferential portion connected to the inner wiring radial portion, the inner wiring circumferential portion is located between one circumferential portion of one of the wirings and one of the slits, and the inner wiring radial portion and one radial portion of one of the wirings are located on a same connecting portion.

* * * * *